US011802351B2

(12) United States Patent
Cadafalch Gazquez et al.

(10) Patent No.: US 11,802,351 B2
(45) Date of Patent: Oct. 31, 2023

(54) METHOD OF MAKING FLEXIBLE CERAMIC FIBERS AND POLYMER COMPOSITE

(71) Applicant: EUREKITE HOLDING B.V., Enschede (NL)

(72) Inventors: Gerard Cadafalch Gazquez, Entschede (NL); Roger Brunet Espinosa, Entschede (NL); Johan Evert Ten Elshof, Entschede (NL)

(73) Assignee: EUREKITE HOLDING B.V., Enschede (NL)

( * ) Notice: Subject to any disclaimer, the term of this patent is extended or adjusted under 35 U.S.C. 154(b) by 0 days.

(21) Appl. No.: 16/304,147

(22) PCT Filed: Jun. 16, 2017

(86) PCT No.: PCT/EP2017/164819
§ 371 (c)(1),
(2) Date: Nov. 22, 2018

(87) PCT Pub. No.: WO2017/216367
PCT Pub. Date: Dec. 21, 2017

(65) Prior Publication Data
US 2020/0318257 A1    Oct. 8, 2020

(51) Int. Cl.
*D01D 5/00*    (2006.01)
*C04B 35/634*    (2006.01)
(Continued)

(52) U.S. Cl.
CPC ........... *D01D 5/003* (2013.01); *B29C 39/003* (2013.01); *B29C 39/38* (2013.01); *B29C 70/42* (2013.01);
(Continued)

(58) Field of Classification Search
CPC .............................. D01D 5/003; D01D 10/02
See application file for complete search history.

(56) References Cited

U.S. PATENT DOCUMENTS 3,574,811 A * 4/1971 Jamison .................... D01F 6/70
                                                        264/184
3,658,979 A * 4/1972 Dunn et al. ........... B21C 23/002
                                                        264/82
(Continued)

FOREIGN PATENT DOCUMENTS

EP        0205704 A        12/1986

OTHER PUBLICATIONS

Yuan Gao et al "Recent Progress and challenges . . . " Jul. 7, 2020 Materials Horizons p. 426ff Royal Society of Chemistry.
(Continued)

*Primary Examiner* — Andrew D Graham
(74) *Attorney, Agent, or Firm* — Andrew Wilford

(57) ABSTRACT

The present application discloses and claims a method to make a flexible ceramic fibers (Flexiramics™) and polymer composites. The resulting composite has an improved mechanical strength (tensile) when compared with the Flexiramics™ respective the nanofibers alone. Additionally a composite has better properties than the polymer alone such as lower fire retardancy, higher thermal conductivity and lower thermal expansion. Several different polymers can be used, both thermosets and thermoplastics. Flexiramics™ has unique physical characteristic and the composite materials can be used for numerous industrial and laboratory applications.

10 Claims, 10 Drawing Sheets

(51) Int. Cl.

| | |
|---|---|
| C04B 35/622 | (2006.01) |
| B32B 5/24 | (2006.01) |
| D04H 1/4209 | (2012.01) |
| D04H 1/728 | (2012.01) |
| D01F 9/08 | (2006.01) |
| C04B 35/628 | (2006.01) |
| C04B 35/626 | (2006.01) |
| C04B 35/638 | (2006.01) |
| C04B 35/64 | (2006.01) |
| H01B 3/12 | (2006.01) |
| H05K 1/03 | (2006.01) |
| C08J 5/24 | (2006.01) |
| B29C 39/00 | (2006.01) |
| B29C 39/38 | (2006.01) |
| B29C 70/42 | (2006.01) |
| D01D 1/02 | (2006.01) |
| D01D 5/14 | (2006.01) |
| D01D 10/02 | (2006.01) |
| D01F 9/10 | (2006.01) |
| B82Y 30/00 | (2011.01) |
| B82Y 40/00 | (2011.01) |
| B29K 105/12 | (2006.01) |
| B29K 309/02 | (2006.01) |

(52) U.S. Cl.
CPC ............ *B32B 5/24* (2013.01); *C04B 35/6225* (2013.01); *C04B 35/6269* (2013.01); *C04B 35/62231* (2013.01); *C04B 35/62236* (2013.01); *C04B 35/62259* (2013.01); *C04B 35/62263* (2013.01); *C04B 35/62844* (2013.01); *C04B 35/638* (2013.01); *C04B 35/6346* (2013.01); *C04B 35/63408* (2013.01); *C04B 35/63444* (2013.01); *C04B 35/63448* (2013.01); *C04B 35/63452* (2013.01); *C04B 35/63456* (2013.01); *C04B 35/63468* (2013.01); *C04B 35/63472* (2013.01); *C04B 35/63484* (2013.01); *C04B 35/64* (2013.01); *C08J 5/248* (2021.05); *D01D 1/02* (2013.01); *D01D 5/0038* (2013.01); *D01D 5/14* (2013.01); *D01D 10/02* (2013.01); *D01F 9/08* (2013.01); *D01F 9/10* (2013.01); *D04H 1/4209* (2013.01); *D04H 1/728* (2013.01); *H01B 3/12* (2013.01); *H05K 1/0393* (2013.01); *B29K 2105/124* (2013.01); *B29K 2309/02* (2013.01); *B82Y 30/00* (2013.01); *B82Y 40/00* (2013.01); *C04B 2235/3206* (2013.01); *C04B 2235/3217* (2013.01); *C04B 2235/3232* (2013.01); *C04B 2235/3244* (2013.01); *C04B 2235/3246* (2013.01); *C04B 2235/3284* (2013.01); *C04B 2235/3418* (2013.01); *C04B 2235/526* (2013.01); *C04B 2235/5256* (2013.01); *C04B 2235/5264* (2013.01); *C04B 2235/781* (2013.01); *C04B 2235/963* (2013.01); *D10B 2101/08* (2013.01)

(56) References Cited

U.S. PATENT DOCUMENTS

| | | | | |
|---|---|---|---|---|
| 5,087,401 A * | 2/1992 | Yokoyama | ................ | D01F 6/62 264/130 |
| 5,223,197 A * | 6/1993 | Boles | ................... | D01D 5/082 264/103 |
| 5,827,797 A * | 10/1998 | Cass | ................ | H01M 4/66 505/430 |
| 9,476,145 B2 | 10/2016 | Reneker | | |
| 9,816,206 B2 * | 11/2017 | Joo | ................... | C04B 35/634 |
| 2003/0106294 A1 * | 6/2003 | Chung | ................ | B01D 39/086 55/486 |
| 2004/0234428 A1 * | 11/2004 | Tanahashi | ......... | C04B 35/62245 422/180 |
| 2005/0224998 A1 * | 10/2005 | Andrady | .............. | D01D 5/0092 264/10 |
| 2006/0117730 A1 * | 6/2006 | Chung | ................ | B01D 46/546 55/524 |
| 2006/0228435 A1 * | 10/2006 | Andrady | ................ | D04H 3/016 425/174.8 R |
| 2007/0243124 A1 * | 10/2007 | Baughman | ................ | C09C 1/56 423/447.1 |
| 2007/0283808 A1 * | 12/2007 | Chung | ................ | B01D 46/546 95/285 |
| 2008/0170982 A1 * | 7/2008 | Zhang | .................. | D01F 9/1273 423/447.3 |
| 2008/0230773 A1 * | 9/2008 | Dickey | .................. | B82Y 10/00 257/40 |
| 2009/0317446 A1 * | 12/2009 | Tan | ..................... | A61L 27/3821 424/423 |
| 2010/0009267 A1 * | 1/2010 | Chase | ................ | B01D 39/2082 429/320 |
| 2010/0074834 A1 * | 3/2010 | Kim | ...................... | D01D 10/02 423/447.3 |
| 2010/0193999 A1 * | 8/2010 | Anneaux | ................ | B32B 5/022 264/438 |
| 2010/0311943 A1 * | 12/2010 | Lallave Rivas | ...... | D01D 5/0092 528/486 |
| 2010/0330419 A1 * | 12/2010 | Cui | ...................... | D01D 5/0084 429/209 |
| 2011/0151738 A1 * | 6/2011 | Moore | ................... | D04H 1/485 442/334 |
| 2011/0281034 A1 * | 11/2011 | Lee | ......................... | B82Y 30/00 427/294 |
| 2012/0003524 A1 * | 1/2012 | Jo | ......................... | H01M 50/406 429/144 |
| 2012/0171488 A1 * | 7/2012 | Yeo | ....................... | B01J 13/0091 428/401 |
| 2012/0217681 A1 | 8/2012 | Zieba | | |
| 2012/0309250 A1 * | 12/2012 | Velev | ........................ | D01F 9/08 57/244 |
| 2013/0068692 A1 * | 3/2013 | Thomas | .................. | C02F 1/286 210/660 |
| 2014/0332733 A1 | 11/2014 | Joo | | |
| 2016/0028089 A1 * | 1/2016 | Arpin | ..................... | H01M 4/04 429/241 |
| 2016/0248118 A1 * | 8/2016 | Chan | .................... | D01D 5/0015 |
| 2016/0308184 A1 * | 10/2016 | Joo | ................... | C04B 35/63488 |
| 2017/0030009 A1 * | 2/2017 | Kim | ......................... | D01D 1/02 |

OTHER PUBLICATIONS

Chao Jia et al, "Mass Production of Ultrafine Fibers . . . " Dec. 16, 2015 p. 1ff Publisher Unknown.

Kenry, "Nanofiber Technology: current status . . . " Oct. 10, 2016 Progress in Polymer Sciencc 70 (Jan. 17, 2021).

Alexander Kolbasov, "Industrial-saale Solution Blowing . . . " p. 323ff I&EC Research, ACS Publications.

Eliton Medeiros, "Solution Blow Spinning: a new . . . " p. 2322ff Journal of Applied Polymer Science vol. 113 2009.

Sumit Sinha-Ray, "Theoretical And Expermental Investigation . . . " p. 0032ff Nov. 19, 2014, Polymer 56, Elsevier Ltd.

Jianan Song, "Blowspinning: a New Choise for Nanofibers" p. 3447ff, Jul. 6, 2020 Applied Materials & Interfaces.

Fatma Yalcinkaya, "Influence of Salts on Electrospinning . . . " Jan. 8, 2015 Jounal of Nanomaterials Hindawi Pub. Corp.

Michael Wojasinski, "Comparative Studies of electrospinning . . . " p. 43ff 2014 Polish Journal of Chem. Tech. 16, 2.

Ramakrishna Vasireddi, "Solution Blow spinning of polymer . . . " Oct. 4, 2019 Scientific Reports Nature Research.

Kmal Sarkar et al "Electrospinning to Forcespinning" *Science Direct*;vol. 13, issue 11;Nov. 2010;p. 12-24.

(56) References Cited

OTHER PUBLICATIONS

Eliton Medeiros "Micro- and Nanofibers from Polymer Solutions" *Wiley Interscience*; 2008.

* cited by examiner

IMG_20141015_171701519.jpg

METHOD OF MAKING FLEXIBLE CERAMIC FIBERS AND POLYMER COMPOSITE

CROSS-REFERENCE TO RELATED APPLICATIONS

None

STATEMENT REGARDING FEDERALLY SPONSORED RESEARCH AND DEVELOPMENT

Not applicable

NAMES OF THE PARTIES TO A JOINT RESEARCH AGREEMENT

Not applicable

INCORPORATION-BY-REFERENCE OF MATERIAL SUBMITTED ON A COMPACT DISK

Not applicable

BACKGROUND OF THE INVENTION

Field of the Invention

The present invention relates generally to composite materials. More particularly, the present invention pertains to flexible ceramic fibers especially nanofibers, and their use to form composite materials and methods of making the same. Even more specifically, the present invention relates to the fabrication of composite materials comprising flexible ceramic micro and nanofibers and polymers using electrospinning, forcespinning and blowspinning methods.

Description of the related art including information disclosed under 37 CFR 1.97 and 37 CFR 1.98

The following description of the art related to the present invention refers to a number of publications and references. Discussion of such publications herein is given to provide a more complete background of the principles related to the present invention and is not to be construed as an admission that such publications are necessarily prior art for patentability determination purposes.

Composites are materials that are made from two or more constituent materials with significantly different physical or chemical properties that, upon being combined, produce a resulting "composite" material with different characteristics than the constituent materials. The goal in making composites is usually to obtain a material with certain enhanced properties or characteristics when compared to the constituent materials.

The prior art reveals numerous examples of ceramic and polymer composite materials, including different combination ratios of a ceramic and a polymer. Ceramic materials used in those composite examples include, but are not limited to: alumina, silica, zirconia, yttrium stabilized zirconia, titania, and titanium carbide. Polymer materials used in those composite examples include, but are not limited to, polyvinyl alcohol, polymethyl methacrylate and polydimethylsiloxane.

The electrospinning process consists of driving a polymer solution jet through a high electric filed rendering a meso-scale fluid jet into nano-scale fibers. The electrospinning process as a method to manufacture "fine" fibers dates back to the early 1900's work of Morton (US 705,691) and Cooley (US 692,631). Morton's and Cooley's patents, as refined by Formhals (U.S. Pat. No. 2,158,416) in 1939, were marred by the current technology limitations. Consequently, the methods developed by Morton, Cooley and Formhals did not teach a way to make nanofibers.

In 1995, Soshi and Reneker reintroduced the electrospinning process, as we know it today, by using then available scanning electron microscope ("SEM") techniques thus resulting in the production of nanofibers. Further, Soshi and Reneker identified numerous applications for electrospun nanofibers in a myriad of fields like structures, textile, membrane and biomedical engineering. (See Sakar et al., Materials Today, Vol. 13, No. 11, 2010).

Polymer micro and nanofibers fabricated with electrospinning were first reported decades ago. However, the first ceramic nanofibers produced from electrospinning were produced relatively recently in 2003. Nevertheless, those nanofibers were not flexible. Flexible ceramic materials comprising electrospun nanofibers have been previously reported even more recently, starting around 2006 (See US 2006/034948 to Reneker et al).

More recently, a method to make nanofibers from a wide range of materials has been developed. That method is known as forcespinning Forcespinning uses centrifugal force instead of electrostatic forces to spin nanofibers, nanowires or nanorods. An example to produce fibers, more specifically nanofibers, using forcespinning is disclosed in JPS 6 125 807 B2. Forcespinning emerged as a faster and cheaper alternative to electrospinning One can make ceramic nanofibers using forcespinning Another method to fabricate micro and nanofibers of polymers and ceramics is blowspinning as disclosed and claimed in U.S. Pat. No. 8,641,960 to Medeiros. Blowspinning uses pressurized air to spin solutions into nanofibers. However, applicants could not find prior art examples of flexible ceramics being made using forcespinning or blowspinning.

Nonetheless, there are prior art examples of other small thickness flexible ceramics being made by using very thin depositions or growths of ceramic materials. The "fabrication of $ZrO_2$ ceramic fiber mats by solution blowing process" is known since 2014 (Ceramics International 40 (2014) published by Bowen Chlang et al.)

One of the main objectives of the invention embodied in the present application is to provide free standing, flexible and continuous ceramic films, also referred to as samples, using either electrospinning, blowspinning or forcespinning. The material which is the subject of the present application will be referred to hereinafter as Flexiramics®, i.e. ceramic nanofiber and flexible mats or films, or generally flexible samples using these ceramic nanofibers. Normally, electrospinning of ceramics yields rigid, nonwoven mats of ceramic micro and nanofibers. Those mats are not continuous and flake shaped. In addition, a substrate that serves as mechanical support is needed. The present invention overcomes all of those shortcomings of the prior art.

SUMMARY OF THE INVENTION

Because of its physical and chemical properties, the free standing, flexible and continuous surface ceramic films, and the composites using the film of the invention embodied in the present application meet or exceed the requirements for many practical, industrial and commercial uses.

For example, the material described and claimed herein can be used to: (1) replace the currently used flexible printed circuit board substrates which are usually made using polyimide (PI); and (2) replace some polymeric protective layers used for cable insulation (polyethylene with aluminum hydroxide filler). Normally, Applicants work with 0% to 50%, especially 12% yttria-stabilized zirconia. I.e. the precursor solution contains zirconia ($Zr^{4+}$) and yttrium ($y^{3+}$) as metallic ions in the ratio 88:12 (zirconia weight:yttrium weight) as at least two of its components. More particularly, the precursor is selected from the group consisting of metallic ions and metal containing polymer and selected from the group consisting of $Si^{4+}$, $Zr^{4+}$, $Ti^{4+}$, $Y^{3+}$, $Al^{3+}$, $zn^{2+}$, $Mg^{2+}$, $Pb^{4+}$, $Ni^{2+}$, $Sr^{2+}$, $Ca^{2+}$, $La^{3+}$.

However, Applicants have found that thin layers of several metal oxides including but not limited to aluminum oxide, silica and titanium oxide, zinc oxide, magnesium oxide and perovskites can also form the basis to produce flexible nonwoven freestanding mats of ceramic fibers.

The film composites or generally the samples of the present invention made of the ceramic nanofibers are bendable to a bending radius close to 0° as shown in FIG. 6D. Experimental data show that the material of the present invention can undergo a fatigue test where it can be bent 45° and brought back to flat in a 3-point-bending test as shown in FIG. 2. Further, the material of the present invention can withstand over 2000 cycles of fatigue whereupon the material degrades but it does not break.

GENERAL DESCRIPTION OF THE INVENTION

This invention describes the fabrication of composite materials with enhanced properties compared to the original materials. The said composition consists of ceramic micro and nanofibers, simply called ceramic nanofibers in the following, and polymers. The ratio polymer/ceramic ranges from >0% to <100%. The invention is directed to the production of flexible ceramic nanofibers as well as a composite material or a film or generally a sample using the flexible ceramic nanofibers. In the latter case the flexible ceramic nanofibers form a flexible ceramic composite material.

To produce the ceramic nanofibers the fabrication process starts by preparing the precursor solution as described above. The solution comprises the dissolved metal's precursor and the polymer to increase the solution's viscosity. To dissolve the metals, solvents like toluene or hexane are suitable because of their volatile character at room temperature. The solid content (polymer and precursor) must be above 5% by weight in the precursor solution (solvent plus metal plus polymer) in order to get a nice deposition. The (kinematic) viscosity of the solution (polymer plus metal's precursor/metal plus solvent) must be kept between 0.01 and 5000 Pascal-second (Pas) at a shear rate of $0.01\ s^{-1}$ to $1\ s^{-1}$ preferably at a shear rate of $0.1\ s^{-1}$, in order to be able to spin proper fibers. The viscosity and shear rate is measured for example with a method and system disclosed in U.S. Pat. No. 8,881,577 B1.

The diameter of the spun fibers depends on the precursor and polymer content. I.e. it is possible to increase the fiber diameter by increasing the polymer and/or metal's precursor content in the solution.

The second stage of the applied procedure according to the invention is the spinning process which can be preferably forcespinning or electrospinning. Also blowspinning is possible. The parameters of the spinning process like diameter of the used needle, distance from a porous collector and injection rate of the solution (compare the already mentioned publication "Fabrication of $ZrO_2$ ceramic fiber mats . . . ") do not have a big influence on the flexibility of the spun fibers. Therefore they are set to get a continuous film or mat or generally a continuous sample of the polymeric fibers (the fibers leaving the electrospinning needle used for ejecting the solution).

The last step is the annealing. This stage is necessary because the fibers leaving the spinning process are not yet ceramic fibers. Due to the thermal treatment while annealing all the organic components of the polymeric fibers are burned out. Additionally the temperature treatment oxidizes the metal ions to form a ceramic. The temperature profile is preferably trapezium shaped over the time as depicted in FIG. 3. The first stage of the annealing works with an increasing temperature up to a fixed value of several 100° C. The annealing temperature needs to be above the crystallization point of the metal ions to form ceramics. The annealing temperature is kept constant for up to several hours (the dwell time). Afterwards the fibers are cooled. The heating and cooling rates are varied according to FIG. 4 from 1° C./min up to 5° C./min and finally up to a thermal shock, i.e. from room temperature (RT) to the annealing temperature (RTA) either by thermal convection (thermal convection oven) or in a microwave oven (MW). Due to the optional trapezium shaped temperature profile during annealing as shown in FIG. 3 the crystal size could be set to 10 nm up to 25 nm by way of example as shown in FIG. 4.

It is worth to note that the trapezium shaped temperature profile is only one preferred possibility. Because the heating and cooling rates could contain some plateaus. For example, it is possible to heat at 5° C./min until 150° C. are reached. Then the temperature is kept for 15 min. Afterwards, the temperature is increased up to 250° C. at a heating rate of 1° C./min, hold for 1 h and then increased at 5° C./min until the final temperature is reached.

The smoothness of the ceramic nanofibers depends on the annealing parameters as shown in FIG. 7 leading to values of 0.3 nm up to 0.8 nm in the example. The smoothness corresponds to the root mean square roughness $R_q$ and it depends on the heating/cooling rates as well as the method (convection/microwave). As expected, the crystal size decreases with increased heating/cooling rate and therefore the smoothness decreases accordingly.

The second process according to the invention uses the spun (nonwoven) ceramic nanofibers as a flexible ceramic filler or generally the ceramic sample (film or mat) made from the nanofibers. The sample, i.e. the resulting nonwoven mat, is shown in FIG. 5. The ceramic sample is impregnated by a polymer solution resulting in a composite material made of the sample and the polymer where the ceramic nanofibers are single coated with the polymer. The composite or composite material forming a film which can be bent to a bending radius close to 0°, i.e. the opposite ends of the film can be bent together with the ends approaching each other as shown in FIG. 6A to 6D.

The following detailed description mainly focuses on composites made of the samples produced from the ceramic nanofibers with the polymers. The composites can be prepared with ceramic nanofibers and generally thermoplastics as the polymer. If the thermoplastic is melt, dense composites can be achieved. However, by diluting the polymer with the solvent, dense or single nanofiber coated composites can be achieved. Composites can also be made with thermosetting resins, requiring curing temperatures. Depending on the amount of solvent added to the thermoset, also dense or single fiber coated composites can be obtained.

DETAILED DESCRIPTION OF THE INVENTION

Objects, advantages and novel features, and further scope of applicability of the present invention will be set forth in part in the detailed description to follow, taken in conjunction with the accompanying drawings. The objects, advantages and novel features, and further scope of applicability of the present invention will become apparent to those skilled in the art upon examination of the following, or may be learned by practice of the invention. The objects and advantages of the invention may be realized and attained by means of the instrumentalities and combinations particularly pointed out in the appended claims.

A principal objective of the invention embodied in the present application is to make Flexiramics® for the preparation of composite materials with several polymers to increase the properties of the polymer by adding the ceramic nanofibers. Besides, the composite has a higher mechanical strength (tensile strength) than the Flexiramics®. The polymers can be thermosetting resins (a curing temperature is needed to create a full polymer cross-linking, typically between 20° C. and 300° C.) or thermoplastics (a melting temperature is needed to soften and make the polymer fluid, typically between 100° C. and 400° C.). The thermoplastics can also be dissolved like the thermosetting resins. Therefore not only a melting temperature is needed.

Specifically, Applicants have used polydimethylsiloxane (PDMS) as polymer to make the composites. Applicants have prepared PDMS/ceramic nanofiber composites ranging from weight ratios of 0.1 to 99.9% of ceramic/total weight of the final product. Applicants have achieved the high ratios by using diluted PDMS precursor solutions. Dilution percentages typically ranged from 70% to 90% in the solution. I.e., the final solution contains 10% to 30% volume percentage of polymer and 70% to 90% volume percentage solvent. The preferred solvents used to dilute the PDMS precursors were toluene and hexane. The viscosity of the resulting diluted solution was typically between 80 to 200 Millipascal per Second (mPas).

Generally, to achieve that desired viscosity range, a pre-crosslinking at 60° C. was needed. Due to the low viscosity of the solution, the ceramic nanofibers can be easily impregnated by applying the solution preferably over the top of a sample, i.e. the ceramic nanofibers, extended on a flat and rigid surface. This can be achieved using a casting knife or a spray coating gun. Due to capillarity and gravity, the ceramic nanofibers become completely impregnated with the solution.

Next, the polymer was thermally cured by placing the sample, i.e. the ceramic nanofibers impregnated with the PDMS precursor solution, into an oven at temperatures between 60° C. and 90° C. The curing step can be achieved at temperatures as low as 20° C. with the only effect being longer curing times. The resulting composite (the sample of the ceramic nanofibers impregnated with the polymer) maintained the desired fibrous structure due to the fact that Applicants applied the PDMS as a thin coating on every individual ceramic nanofiber. In the preferred embodiment of the invention, the coating was in the range of a few tenths to a few hundred nanometers.

Applicants achieved the desired low ceramic nanofiber/total weight ratios by embedding the ceramic fibers in non-diluted PDMS precursor solutions. The non-diluted PDMS precursor solutions preferred viscosity range between 1000 to 150000 (mPas), preferably 1500 and 15000 (mPas). Applicants then casted the non-diluted solutions on flat and rigid surfaces with preferred thickness between 0.1 to 5.0 millimeters (mm).

Next, the ceramic nanofibers were deposited on top of the casted solution, thus allowing the solution to permeate through the entire sample, i.e. the entire ceramic nanofibers, via capillarity forces.

Next, the sample was thermally cured by placing it into an oven at temperatures between 60° C. and 90° C. The curing time was inversely proportional to the curing temperature. For example, at 60° C., the curing time was one (1) hour.

The cured sample comprises a thick PDMS layer on one side (between 0.1 to 5.0 mm), and a thin PDMS layer of a few micrometers on the other side, typically from 1 .mu.m to 5 mm. It is also possible that the cured composite comprises in one or both sides a PDMS layer of a typical thickness of 1 .mu.m to 5 mm. It is also possible that none of the sides comprises a PDMS layer if the casted thickness contains just the exact amount of PDMS to infiltrate the ceramic nanofibers.

In an alternative embodiment of the invention, Applicants prepared composites with thicker PDMS layers on both sides of the composite by casting an extra PDMS precursor solution layer on top of existing PDMS layers. Applicants can easily control the thickness of that layer by modifying the viscosity of the PDMS precursor solution. In order to increase the viscosity of the PDMS precursor solution, short thermal treatments at moderate temperature (between 30° C. to 60° C.) can be performed. Alternatively, Applicants can decrease the viscosity of the PDMS by mixing small amounts of toluene or hexane (1% to 99 vol %) with the PDMS precursor solution.

In yet another alternative embodiment of the invention, polyethylene (PE) was used to prepare composite materials with the ceramic nanofibers. In that embodiment, PE was melted at temperature above its melting point of 135° C. The melted PE was then applied on top of the ceramic nanofibers applying sufficient pressure (typically between 1 to 10 kilo Newtons) for a complete embedding of the PE onto the ceramic nanofibers. This was done using a hot-press melt equipment, which resulted in the application of sufficient pressure. The composite was then allowed to cool down to room temperature resulting in different PE thicknesses on the surface of the composite ranging from 0.1 to 5.0 mm. The prior calibration of the amount of PE results in being able to control the thickness of the PE layer. Therefore, a wide range of PE/ceramic nanofibers/total weight ratios can be achieved.

Another embodiment of the invention can be achieved by double side coating after the deposition of the first PE layer. The thickness of the new PE layers can be controlled by adjusting the opening of the slot die of a pistol equipment and by manipulating the viscosity of the molten PE by increasing or decreasing the temperature used to melt the polymer. These controlling steps result in a broad range of PE/ceramic nanofibers ratios that can be predictably modified depending on the application.

Another embodiment of the invention comprises the use of polyurethane (PUR) for making composite materials. In that embodiment, the PUR precursor is melted under temperatures above 200° C. The melted PUR precursor is then applied on top (or on bottom) of the ceramic nanofibers using a pistol equipment with a slot die head. Next, the resulting PUR precursor/ceramic nanofibers sample is thermally cured inside an oven at approximately 100° C. The resulting composite embodiment has a thickness ranging typically from 1 .mu.m to a few mm, preferably from 0.1 mm to 5.0 mm.

Another embodiment of the invention can be obtained by using Polyimide (PI) as the polymeric material for the fabrication of composite materials with the ceramic nanofibers. In order to obtain that embodiment of the invention, Applicants dissolved poly(amic acid) in N-Methyl-2-pyrrolidone (NMP) resulting in the PI precursor solution with typical viscosities of 1000 to 10000 mPas. In order to obtain alternative embodiments of the precursor solution, Applicants used solvents like nmP and .gamma.-butyrolactone. The solution was then casted on a flat and solid surface and the ceramic nanofibers were deposited on the top, thus allowing the solution to penetrate through the entire sample, i.e. the ceramic nanofibers, via capillarity forces. Next, the sample, i. e. the ceramic nanofibers impregnated with the PI precursor solution, was dried typically at 80° C. for 1 h and then was thermally dried by applying heat typically up to 300° C. using a hot plate or a furnace, typically for 30 minutes. Upon allowing the composite to cool down, it presents polyimide films on both sides of the ceramic nanofibers, typically ranging from 1 to 100 .mu.m. That thickness can be modified or suppressed by casting thinner or thicker PI precursor solution films.

The method of the present invention can be executed using a pistol with a slot die head, as well as other techniques like the doctor blade or the casting knife. The resulting composites were dense but the fibrous structure of the ceramic nanofibers can be maintained by diluting the poly (amic acid) respective PI with higher amounts of solvents in order to decrease the viscosity down to a range of e.g. 50 to 300 mPas. Then, ceramic nanofibers could be individually coated with thin polyimide coatings as described above for the PDMS.

These composite materials can also be prepared with different polymers (thermoplastics or thermosetting resins) like polypropylene (PP), polyether ether ketone (PEEK), Polyethylenimine (PEI), cyanate esters, epoxy resins, polyesters, vinyl esters, urea-formaldehyde, allylics, polyphthalamide (PPA), polyphenylene sulfide (PPS) and polytetrafluoroethylene (PTFE) and polybenzimidazole (PBI). The techniques applied would be the same than before, namely, spray coating, pistol with slot head die, doctor blade, casting knife and hot press melt.

This composite materials retain their flexibility and can be bent to very low bending radius without breaking or being damaged, even when the polymeric content does not even exceed 5% per weight in the final product. Additionally, these composites present a great enhancement of the thermal properties as compared with the polymers themselves. For example, the composite made with PDMS catches fire two times slower than freestanding PDMS foil (of the same thickness) when exposed to a methane flame. The composite made with PE can even retard the flame at least twice and up to one order of magnitude more than free standing PE of the same thickness. Furthermore, when the composite material is burning, there is no dripping of any part, preventing the fire to spread. Instead, a protective crust is formed. Another example to illustrate the excellent thermal properties of the composite material prepared with polyimide is that it can resist exposures at temperatures as high as 500° C. without losing flexibility and flatness when the ceramic content is typically 25% per weight in the final product. Instead, a freestanding polyimide film of the same thickness, starts wrinkling at temperatures around 300° C. or higher because the glass transition of the polyimide is surpassed. In general, the ceramic nanofibers can be used to create bendable composites with higher thermal endurance and better flame fire-retarding properties. The ratio of ceramic/total weight in the final product can range from very low, being a dense polymer film with very low content of ceramic fibers, to very high, being a porous films (nonwoven) with the ceramic fibers individually coated with polymer.

The ceramic nanofibers of the present invention are flexible in a macroscopic scale (as a mat) and at a single fiber scale. The mechanical properties of the material of the present invention can be attributed to several factors:

- The elongated shape comprising a fiber diameter that ranged between 20-10000 nm thus allowing bendability;
- The fiber lengths are measurable up to 4 cm, however, they are presumed to be longer;
- Small crystal sizes ranging from 1 to 100 nm with smaller grains allowing increased ductility;
- Fiber smoothness ranging between 0.05 and 5 nm Root Mean Square Roughness (Rq); and
- The fibers are not physically attached to each other in the nonwoven mat form of the material of the present invention which allows the fibers to freely move and have a more bendable material at a macroscopic scale.

The composite materials of the present invention comprising nonwoven ceramic micro and nanofibers (Flexiramics®) and polyimide present optimal thermal stability. At exposures at temperature as high as 400° C. to 500° C., i.e. an exposure for several minutes, the composite does not wrinkle nor loses flexibility and therefore, increases the temperature threshold at which it can be used. Additionally, the material is light and has a low density (10-40 g/m$^3$).

The composite materials of the present invention comprising Flexiramics® and polyethylene present optimal fire retarding properties. Applicants have found that it takes at least twice as long for that material to start catching fire when compared with materials of the prior art being used for similar purposes. Additionally, once the material of the present invention starts combusting, no parts drip and the fire can be contained because a crust of the calcined material is formed and held onto the fibers. That crust also prevents the flame from propagating through the material.

DESCRIPTION OF THE PREFERRED EMBODIMENT OF THE INVENTION

The preferred embodiment of the present invention describes the preparation of the ceramic nanofibers. The method comprising the following steps:

1. Preparation of a precursor solution, the precursor solution comprising the metallic ions or inorganic polymer (sol) that will form the final metal oxide (ceramic), as well as polymer to increase the viscosity.
   a. Sol-gel parameters can be used to increase the viscosity of the solution but sol-gels are not fully necessary since the viscosity can also be modified by the use of additives.
   b. Bigger fiber diameters can be achieved by increasing the polymer content and/or precursor content. This must be tuned to achieve the desired fiber diameters.
   c. The material's viscosity must be kept between 0.01 and 1000 Pascal second (Pa-s) at a shear rate of preferably 0.1 s$^{-1}$ in order to spin usable fibers.
   d. The solid content (polymer plus precursor) must be above 5% per weight in order to obtain the required deposition.

e. The utilized solvents must be carefully chosen in order to provide an evaporation rate that is high enough. This can be done, but is not limited to, by mixing water with alcohols as it increases the evaporation rate.
2. Spinning the precursor solution by using forcespinning or electrospinning or blowspinning.
  a. The spinning parameters have little or no effect on the flexibility of the resulting polymeric fiber.
  b. Instead, the spinning parameters are tunable so that the spinning step can result in a continuous film or polymeric fiber. This must be adapted to each different solution.
3. Annealing the fibers obtained from the spinning process which are not ceramic after the spinning Instead, the spun fibers are polymeric fibers comprising ionic metal or inorganic polymer.
  a. Annealing the fibers until all the organic content is burned out and the metal ions oxidize to form a ceramic.
  b. A typical thermal profile is generated as shown in FIG. 3 with a preferred trapezium shaped thermal profile which displays parameters of the annealing process comprising heating/cooling rate, annealing temperature and dwell time. It must be noted that the profile is essential to be tuned to obtain the desired crystallinity presented above.
  c. The parameters of the annealing process being distinct as to each material composition. For example, heating/cooling rates as low as 0.5° C./min, preferably as low as 1° C./min, and as high as a thermal shock (from room temperature to the annealing temperature).
  d. The annealing temperature having to be above the crystallization point thus allowing the formation of ceramic material.
  e. The dwell time ranging from 0 to 5 hours and even higher.

BRIEF DESCRIPTION OF THE SEVERAL VIEWS OF THE DRAWINGS

The accompanying drawings, which are incorporated into and form a part of the specification, illustrate an embodiment of the present invention and, together with the description, serve to explain the principles of the invention. The drawings are only for the purpose of illustrating a preferred embodiment of the invention and are not to be construed as limiting the invention. The scope of the invention can only be limited by specific limitations contained in the appended claims.

Simple sketches that allow one not necessarily familiar with the technical area to which this application pertains to gain a visual understanding of the invention.

Figure 1:
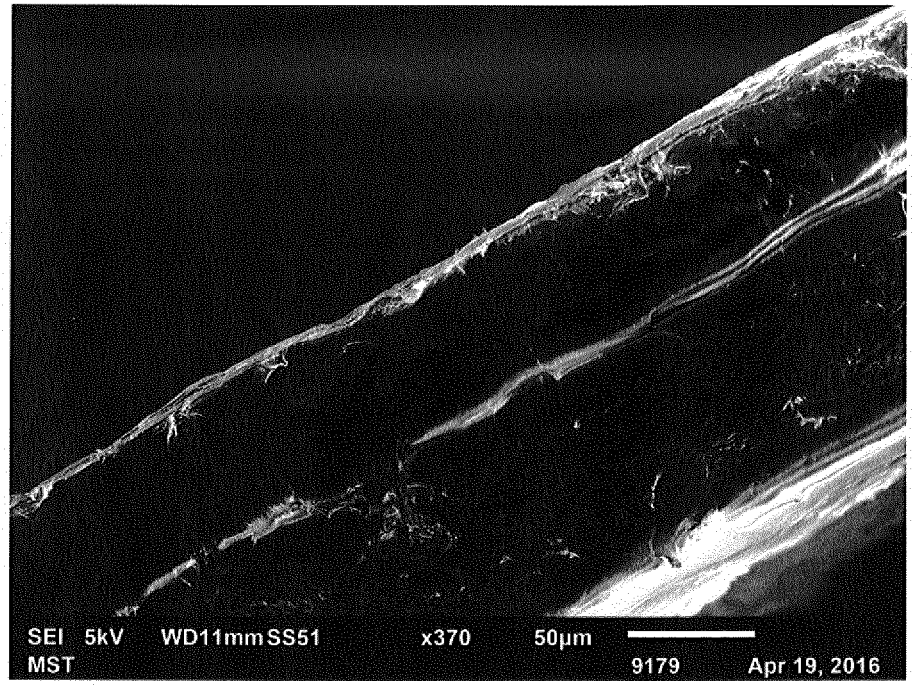
FIG. 1: A photographic depiction of Flexiramics® embedded in polyimide having a thick layer on one side (top) and a thin layer on the other side (bottom).
Figure 2:
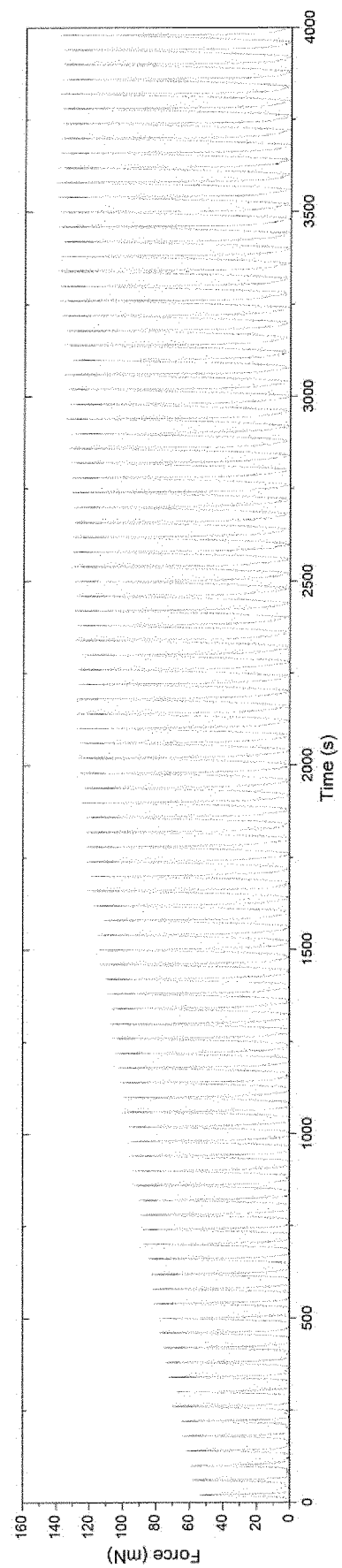
FIG. 2: A graphic showing the ceramic nanofibers 3 point bending fatigue test measured in force versus time.
Figure 3:
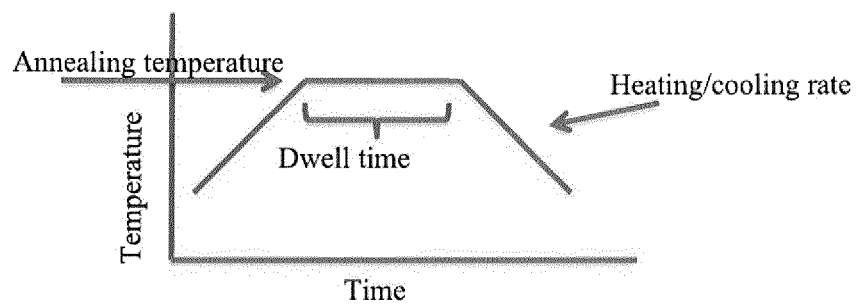
FIG. 3: A typical thermal profile which displays parameters of the annealing process comprising heating/cooling rate, annealing temperature and dwell time.
Figure 4:
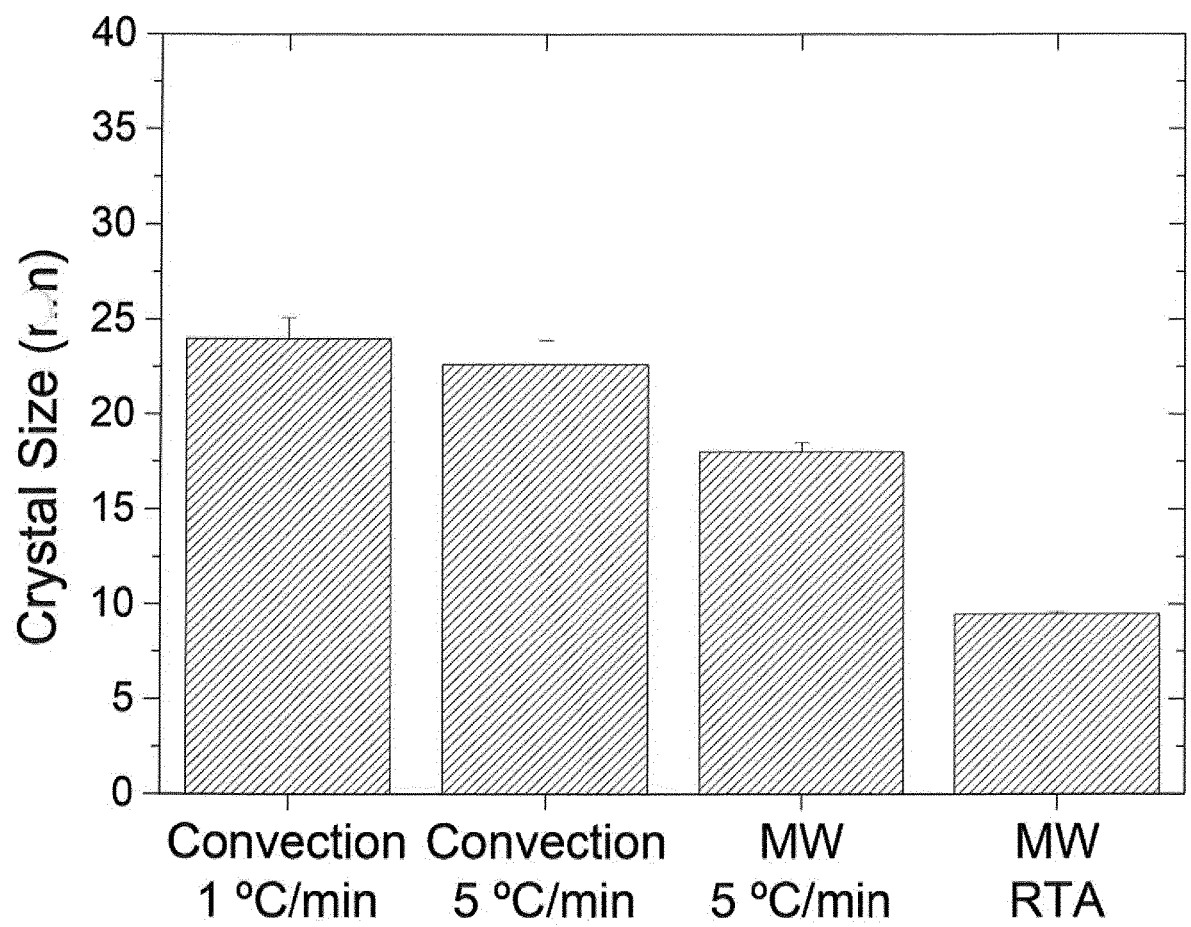
FIG. 4: A graphical depiction illustrating the dependency of the crystal size of YSZ (12% yttria-stabilized zirconia) nanofibers on the annealing step. The annealing vary from convection oven to microwave (MW). The heating and cooling rate range from 1° C./min to thermal shock (RTA).
Figure 5:
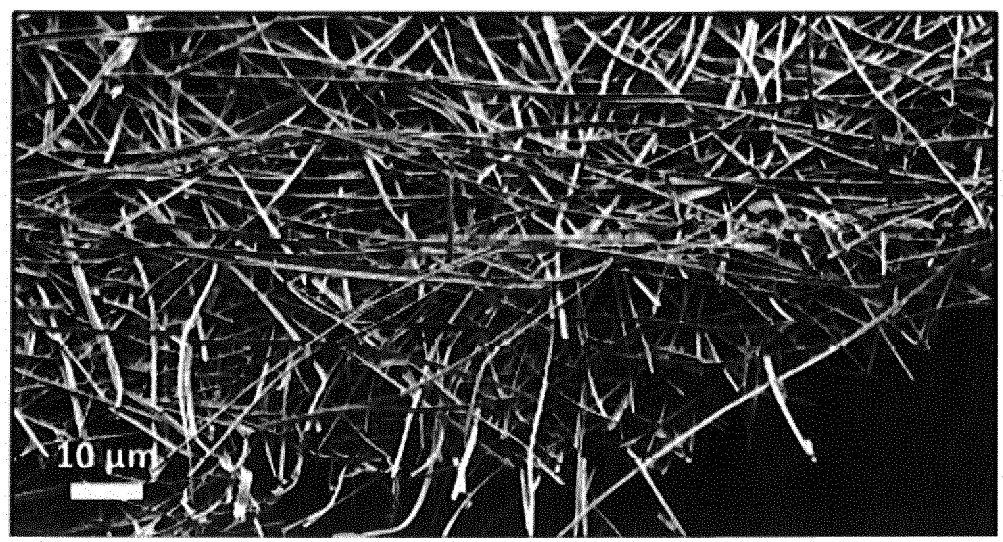
FIG. 5: A microphotograph of the formed flexible YSZ nonwoven fiber mat.
Figure 6A:
FIG. 6A to 6D: Photographic depictions of the resulting flexible ceramic YSZ material (Flexiramics®) clearly showing the material's bendability and its pure ceramic nature by being not flammable.
Figure 6:
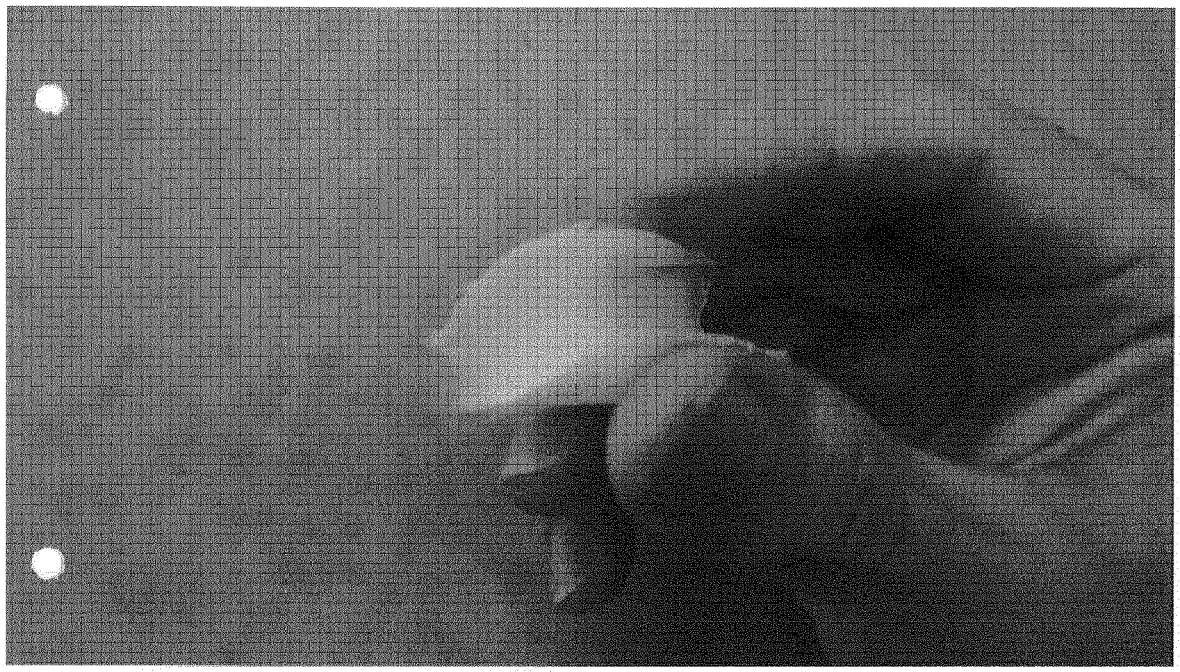
Figure 6C:
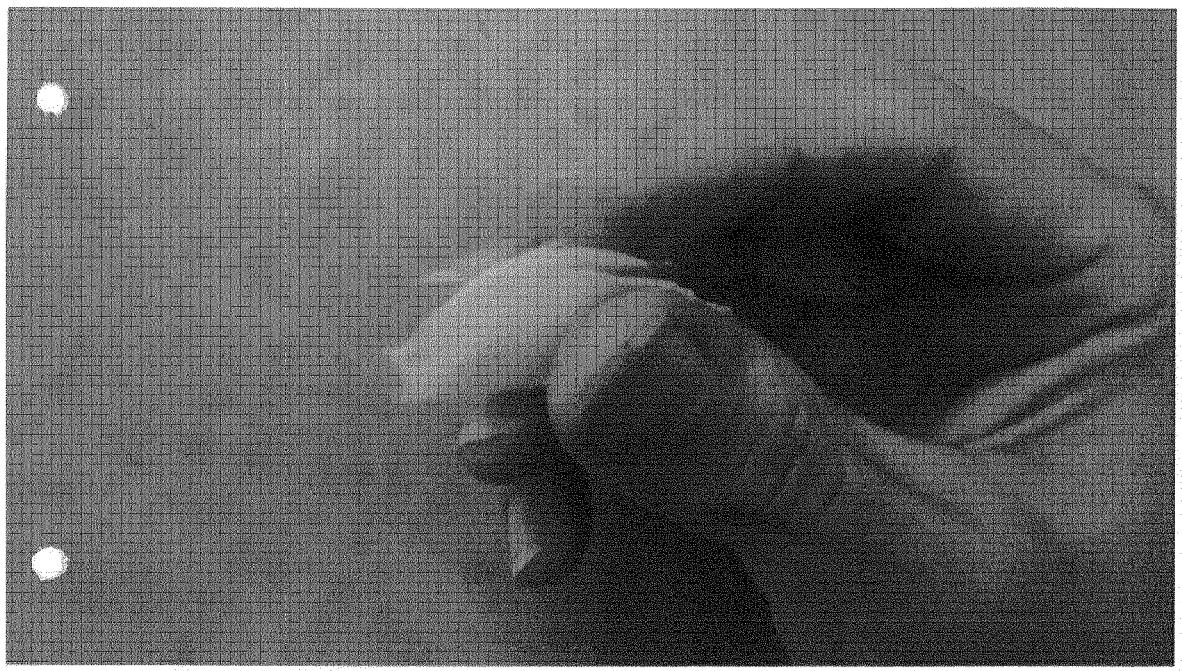
Figure 6D:
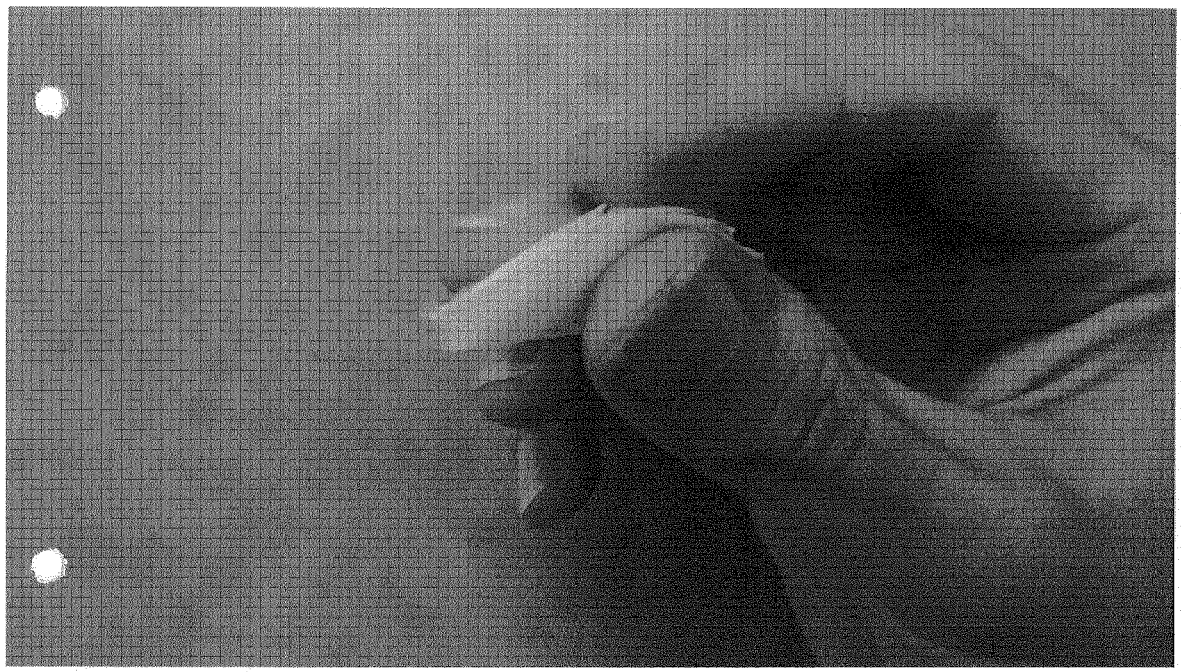
Figure 7:
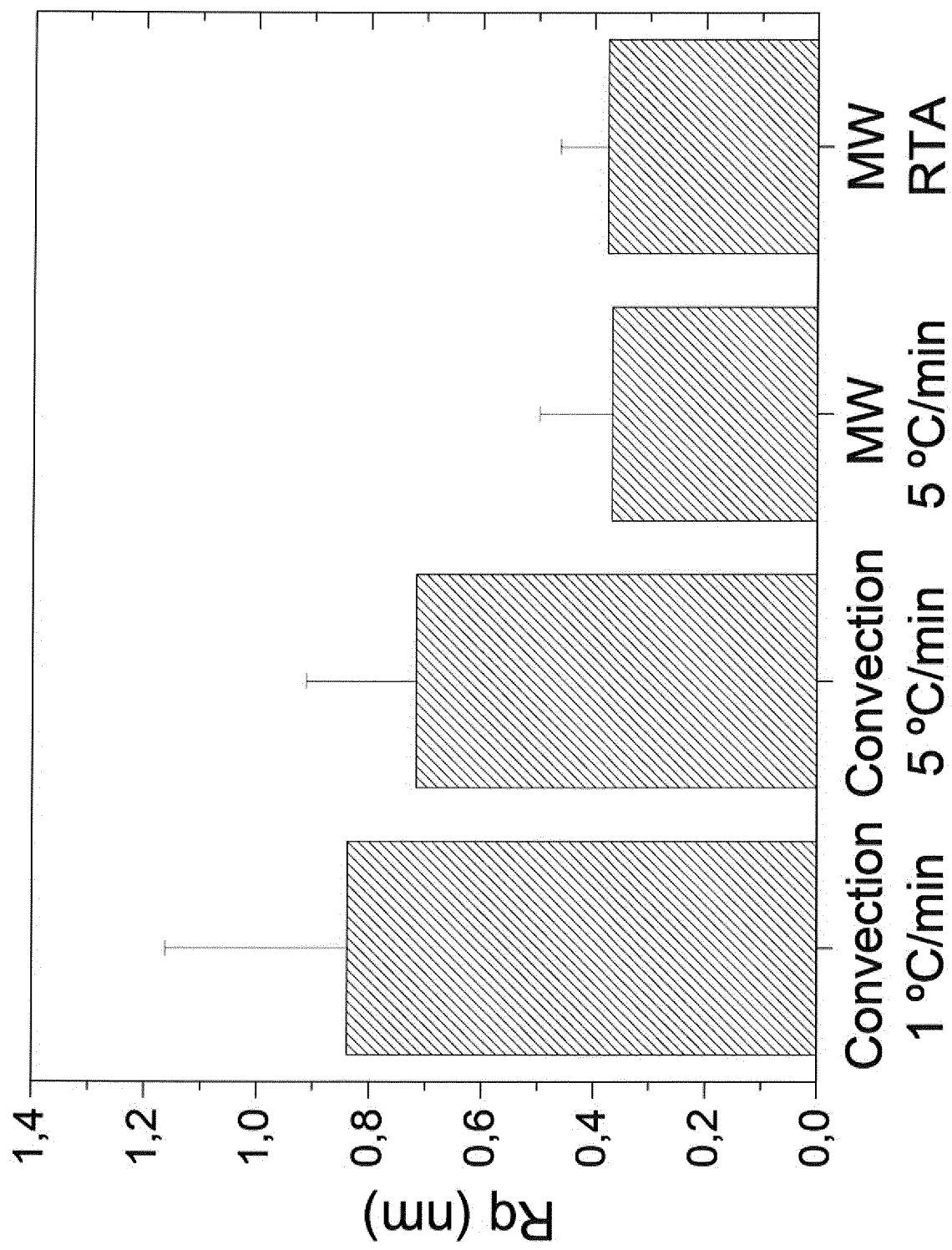
FIG. 7: A graph illustrating the dependence of the roughness of YSZ nanofibers on the annealing step. The annealing vary from convection oven to microwave (MW). The heating and cooling rate range from 1° C./min to thermal shock (RTA).

The invention claimed is:
1. A process for making a flexible composite material comprising flexible ceramic nanofibers and a polymer, the process of making flexible ceramic nanofibers comprising the steps of:
  a) preparing a ceramic fiber precursor solution comprising
    (i) a dissolved metal precursor for ceramic selected from the group consisting of metallic ions and metal containing polymer and selected from the group consisting of $Si^{4+}$, $Zr^{4+}$, $Ti^{4+}$, $Y^{3+}$, $Al^{3+}$, $Zn^{2+}$, $Mg^{2+}$, $Pb^{4+}$, $Ni^{2+}$, $Sr^{2+}$, $Ca^{2+}$, $La^{3+}$;
    (ii) a polymer to increase the precursor solution viscosity, with the solid content of the precursor solution being above 5% by weight in order to obtain the required deposition, and
    (iii) solvent capable of providing the precursor solution a sufficiently high evaporation rate;
  b) allowing the dissolved metal precursors for ceramic to form a final ceramic metal oxide;
  c) maintaining the precursor solution viscosity between 0.01 and 1000 Pascal-second at a shear rate of 0.01 to 1 $s^{-1}$ in order to spin usable fibers;
  d) blow spinning the precursor solution while setting the spinning parameters so that the spinning results in polymeric fibers and adapting the spinning parameters to the precursor solution;
  e) annealing the polymeric fibers comprising the metallic precursors comprising the metal precursors for ceramic obtained from the spinning process until all organic content is burned out and the metallic ion oxidizes to form a ceramic;
  f) tuning and calibrating annealing parameters comprising heating and cooling rates, annealing temperature and dwell time consistent with a trapezium shaped thermal profile so a crystallinity comprising a crystal size of 1 to 100 nm and a smoothness of 0.05 to 5 nm of root mean square roughness of the resulting 20 to 10000 nm thick fibers is obtained, the annealing parameters being distinct and specific with respect to material composition;
  g) setting the annealing temperature above a crystallization point of the ceramic fiber to form ceramic material; and
  h) rendering the composite dense with no porosity by the steps of either
    a') casting non-diluted or little diluted polymeric solution on the ceramic nanofibers on flat and rigid surfaces with thickness between 0.1 to 5.0 millimeters;
    b') depositing the ceramic nanofiber on top of the cast solution thus allowing the solution to permeate through the entire sample via capillary forces; and
    c') thermally curing the resulting solution permeated sample by placing the sample into an oven at temperatures between 20° C. and 300° C. over a pre-determined curing time, and the cured sample comprising a poly- mer layer on one or on both sides of the composite with a thickness ranging from 1 μm to 5 mm;

or a") melting the polymer on top or bottom of the ceramic nanofibers;

b") applying pressure and/or temperature for better infiltration of the polymer in the ceramic nanofiber matrix, and c") decreasing the temperature to solidify the polymer.

2. The process for making the flexible composite material of claim 1, further comprising the step of:

selecting the composition of the flexible ceramic nanofiber from the group consisting of yttria-stabilized zirconia, zirconia, titania, alumina, zinc oxide, silica, magnesium oxide and pervoskites.

3. The process for making the flexible composite material of claim 1, wherein the polymer is selected from the group consisting of polydimethylsiloxane, polyimide, polypropylene, polyethylene, polyether ether ketone, polyethylenimine, polyurethanes, cyanate esters, epoxy resins, polyesters, vinyl esters, urea-formaldehyde, allylics, polyphthalamide and polyphenylene sulfide, polytetrafluoroethylene, polybenzimidazole and the ceramic content is between 0.1 to 99.9% of ceramic/total weight resulting in a composite that retains a flexibility of nearly 0° bending radius.

4. The process for making the flexible composite material of claim 1, wherein the resulting flexible ceramic nanofibers comprises a fiber diameter that ranges between 20 and 10000 nanometers thus allowing bendability of the ceramic nanofibers, a fiber length being measurable up to at least 4 centimeters, a crystal size ranging from 1 to 100 nanometers, a fiber smoothness ranging from 0.05 to 5 nanometers root mean square roughness and the fibers being disposed in a non-woven mat form in which the fibers are not physically attached to each other thus allowing the fibers to freely move and be bendable at a macroscopic scale.

5. The process for making the flexible composite material of claim 1, wherein the resulting composite material comprises more than 0% and less than 100% of ceramic/total weight by embedding the flexible ceramic nanofiber with polymeric solution of viscosity between 50 to 150 000 mPa s, with the coating step selected from the group consisting of casting a polymeric solution over a flat substrate by allowing impregnation by capillarity and/or gravity.

6. The process for making the flexible composite material of claim 1, wherein the resulting composite material comprises more than 0% and less than 100% of ceramic/total weight by casting a polymeric solution through a casting device selected from the group consisting of an extruder equipped with a slot die head, a casting knife, a spray coating gun and a doctor blade on top of the flexible ceramic filler thus allowing impregnation by capillarity.

7. The process for making the flexible composite material of claim 1, wherein the resulting composite material comprises more than 0% and less than 100% of ceramic/total weight by pressing and heating the solid polymer and the ceramic filler with typical pressures ranging between 1 and 10 kilo Newtons in a hot press melt.

8. The process for making the flexible composite material of claim 1, wherein the resulting composite material comprises more than 0% and less than 100% of ceramic/total weight by using thermosetting resin requiring curing temperatures ranging from 20 to 500° C. and thermoplastics requiring melting temperatures up to 700° C.

9. The process for making the flexible composite material of claim 1, wherein the resulting composite material is used to replace flexible printed circuit board substrates made using polyimide or polyimide with low ceramic fillers.

10. The process for making the flexible composite material of claim 1, wherein the resulting composite material is used to replace polymeric protective layers used for cable insulation.

* * * * *